(12) United States Patent
Kwok et al.

(10) Patent No.: US 7,402,947 B2
(45) Date of Patent: Jul. 22, 2008

(54) ANODE FOR ORGANIC LIGHT EMITTING DIODE

(75) Inventors: Hoi Sing Kwok, Kowloon (HK); Man Wong, New Territories (HK); Hua-Jun Peng, Kowloon (HK); Shuang Xie, Beijing (CN)

(73) Assignee: The Hong Kong University of Science and Technology, Kowloon (HK)

( * ) Notice: Subject to any disclaimer, the term of this patent is extended or adjusted under 35 U.S.C. 154(b) by 358 days.

(21) Appl. No.: 11/219,747

(22) Filed: Sep. 7, 2005

(65) Prior Publication Data

US 2006/0049754 A1    Mar. 9, 2006

Related U.S. Application Data

(60) Provisional application No. 60/607,724, filed on Sep. 8, 2004.

(51) Int. Cl.
*H01J 1/62* (2006.01)
(52) U.S. Cl. ...................................... 313/504; 313/509
(58) Field of Classification Search ................ 313/503, 313/504, 509
See application file for complete search history.

(56) References Cited

U.S. PATENT DOCUMENTS 6,501,217 B2 * 12/2002 Beierlein et al. ............ 313/504

* cited by examiner

*Primary Examiner*—Vip Patel
(74) *Attorney, Agent, or Firm*—Barnes & Thornburg LLP (57) ABSTRACT

An organic light emitting diode consisting of multiple organic layers, disposed between a transparent conducting anode and metallic cathode. The anode is provided with a metal fluoride layer to enhance the overall performance of the device, including higher power efficiency, lower voltage threshold and improved device operation stability.

24 Claims, 9 Drawing Sheets

ANODE FOR ORGANIC LIGHT EMITTING DIODE

CROSS REFERENCE

This Application claims the benefit of U.S. Provisional Application No. 60/607,724 filed Sep. 8, 2004, which is incorporated herein by reference.

FIELD OF THE INVENTION

This invention relates in general to flat panel displays based on emission from organic materials, known either as organic light emitting diodes or organic electroluminescent devices. Specifically, this invention relates to the anode used in such devices.

BACKGROUND OF THE INVENTION

Figure 1:
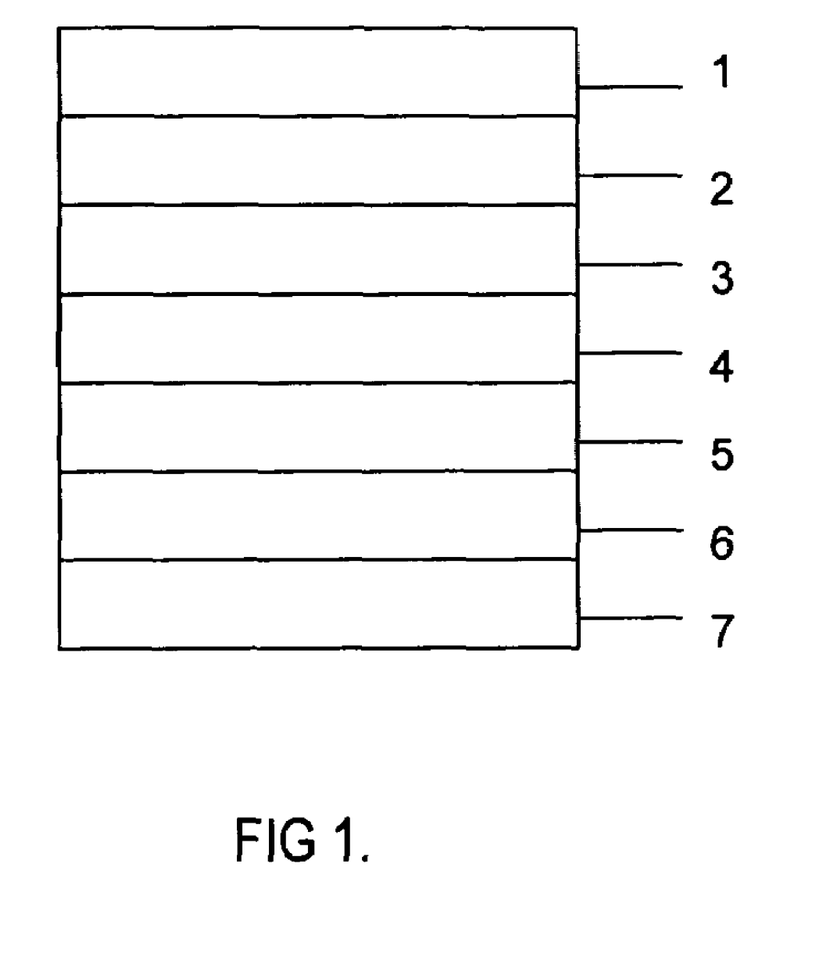
FIG. 1 shows the basic structure of a multi-layer organic light emitting diode.

Organic electroluminescent devices are light emitting devices that are based on the passage of current through one or multiple organic thin layers. FIG. 1 shows a conventional structure. For polymer materials, it is possible to make a single layer organic device sandwiched between a cathode 1 and an anode 6. However, most organic devices are multilayer in nature. Usually, a hole transport layer 4 (HTL) and an electron transport layer 3 (ETL) are needed. One of these electron or hole transport layers can be the light emitting layer (EML), or another light emitting layer 9 (FIG. 2) is deposited between the ETL and the HTL. Examples of typical hole transport materials are TPD and NPB. Examples of electron transport materials are $Alq_3$ and Bphen. $Alq_3$ and doped $Alq_3$ are usually used as the light emitting layer. Much work has been devoted to the optimization of the device structure in terms of the thicknesses of the various layers, and in synthesizing new materials that are more efficient in transporting the carriers and in generating light emission.

PRIOR ART

Much work has also been devoted to the cathode and anode layers. For the cathode 1, usually a low work function metal is needed that can inject electrons into the device efficiently. Metals such as Mg, Ag and Al have been used. A thin buffer layer 2 is usually needed to enhance the performance of the electron injection process. Hung et al discovered that adding an insulating and very thin layer of LiF can enhance the electron injection efficiency of the cathode 1 significantly (L. S. Hung, C. W. Tang, and M. G. Mason, Applied Physics Letters 70(2), pp152-154(1997)). Other types of insulators have also been attempted, such as CsF and ZnO. But LiF is found to be the best so far. It is believed that the function of the insulating layer is to generate interface dipoles that tend to align the Fermi level of the metal with the LUMO level of the electron transport layer.

There has also been much work aimed at improving the hole injection from the anode 6. The anode material is usually indium tin oxide (ITO), which is transparent and conductive. ITO is used almost exclusively because of the need to transmit the emitted light through a transparent electrode. It is much more difficult to make a transparent cathode than a transparent anode. ITO has a Fermi level that is not quite matched to the organic hole transport layer. Various techniques have been invented to improve the hole injection efficiency, such as by plasma treatment of the ITO, ozone cleaning of the ITO, and other types of chemical treatment that can alter the Fermi level of the ITO. This is possible because the electrical properties of ITO depend strongly on the oxygen content.

There are other methods that aim to improve the hole injection by adding a buffer layer 5 to the emitting device. Forrest et al (U.S. Pat. No. 5,998,803) teaches a method where an organic layer 5 with a good conductivity is inserted between the anode and the HTL. The efficiency is improved somewhat. VanSlyke et al. teaches a method whereby a CuPc layer is inserted between the ITO and the hole-transporting layer to obtain a stable organic device (S. A. VanSlyke, C. H. Chen, and C. W. Tang, Applied Physics Letters, Vol. 69, pp2160-2162 (1996)). Mason et al have also found that the indium-tin-oxide (ITO) anode contact to an organic EL device can be significantly improved via oxygen plasma treatment without introducing a CuPc layer (M. G. Mason, L. S. Hung, and C. W. Tang, S. T. Lee, K. W. Wong, and M. Wang, Journal of Applied Physics, Vol. 86(3), pp1688-1692 (1999)). Shen et al teaches a method whereby a metal layer 5 is added between the anode 6 and the HTL 4 (Yulong Shen, Daniel B. Jacobs, George G. Malliaras, Goutam Koley, Michael G. Spencer, and Andronique Ioannidis, Advanced Matererials Vol. 13(16) pp1234-1238(2001)). They observed a great increase in the hole injection efficiency. Recently, Qiu et al have shown that depositing a thin metal oxide layer on the ITO anode can improve the hole injection and light emission efficiency (Chengfeng Qiu, Zhilang Xie, Haiying Chen, Man Wong, and Hoi Sing Kwok, Applied Physics Letters, Vol. 80(19) pp3485-3487(2002)). Hung et al (U.S. Pat. No. 6,208,077) teaches a method whereby a thin non-conductive fluorocarbon polymer layer 5 such as Teflon is added between the anode 6 and the HTL. The organic EL devices using such a thin polymer layer exhibited enhanced hole injection and improved device operational stability. The present invention involves another kind of treatment of the anode surface whereby the hole injection efficiency as well as the lifetime of the OLED can be improved.

SUMMARY OF THE INVENTION

According to the present invention there is provided an organic electroluminescent device comprising an anode, a cathode, and a plurality of organic layers sandwiched between said anode and said cathode; said anode further comprising: (a) a conducting anode layer, and (b) an anode modification layer, wherein the said anode modification layer is formed by exposing the said conducting anode layer to a fluorine-containing gaseous plasma in a low vacuum.

In preferred examples of the invention the anode modification layer is exposed to the said fluorine-containing gaseous plasma for a period of time of no longer than 30 seconds. Preferably the anode modification layer comprises a metal fluoride compound, and if the conductive anode is formed of indium tin oxide then the metal fluoride compound is preferably $InF_x$ Preferably the metal fluoride compound layer has an average thickness in a range of 0.5 to 2.5 mm.

BRIEF DESCRIPTION OF THE DRAWINGS

Some embodiments of the invention will now be describe by way of example and with reference to the accompanying drawings, in which:—

DETAILED DESCRIPTION OF THE PREFERRED EMBODIMENTS

As will be seen from the following examples, at least in its preferred forms the present invention provides an organic light-emitting device comprising a cathode layer, an organic light emitting layer, a transparent conducting anode layer with an ultrathin layer of a fluoride compound being formed between the anode layer and the organic hole transport layer.

The surface treatment of the anode layer is very important to the hole injection efficiency of the device. As will be seen from the following, it has been found that organic EL devices using such a thin metal fluoride layer on an ITO anode exhibit enhanced hole injection, improved light emission efficiency and improved operational reliability. The surface treatment of the anode involves a RF or DC plasma using fluorine-containing molecular precursor. This plasma modifies the surface of the anode as well as providing an ultrathin layer of fluoride on it. It is this ultrathin layer that is responsible for the enhanced operation of the OLED. While particularly effective with an ITO anode, other possible anode materials include metals such as silver, gold, aluminium, nickel and steel.

FIG. 1 shows the basic structure of a typical organic light emitting diode. The structure comprises a cathode layer 1 (for example formed of magnesium, aluminium, silver or a combination thereof), a cathode buffer layer 2, an electron transport layer 3, a hole transport layer 4, an anode buffer layer 5, and an anode layer 6. The structure is usually deposited on a substrate 7 which may be transparent (eg glass or plastics) or opaque (eg ceramic or a semiconductor material such as silicon). Light is usually emitted from the electron transport layer 3 or the hole transport layer 4. A number of techniques may be used to fabricate the device: for example the metal cathode and the organic layers may be formed by thermal evaporation. The anode layer may be deposited by sputtering.

Figure 2:
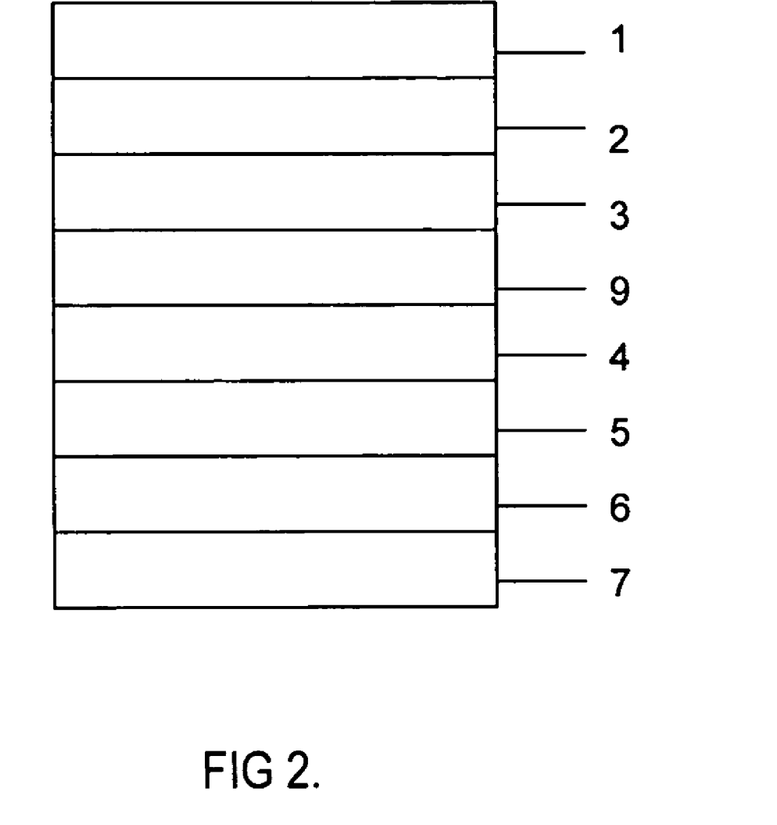
FIG. 2 shows another basic structure of a multi-layer organic light emitting diode.

FIG. 2 shows a common variation of the basic structure where a light emitting layer 9 is added between the electron transport layer 3 and the hole transport layer 4.

Figure 3:
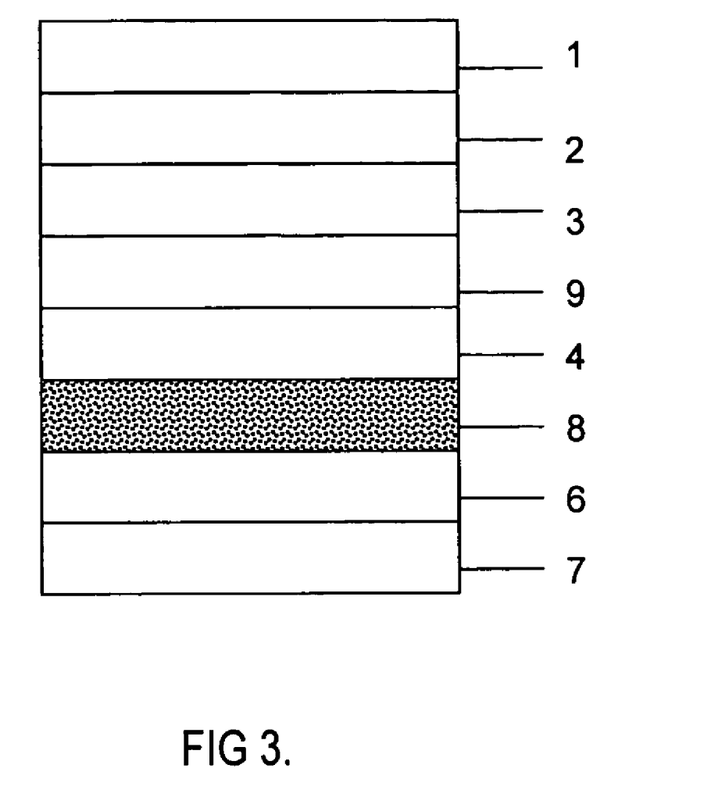
FIG. 3 shows the structure of a first embodiment of an organic light emitting diode according to the present invention.
Figure 4:
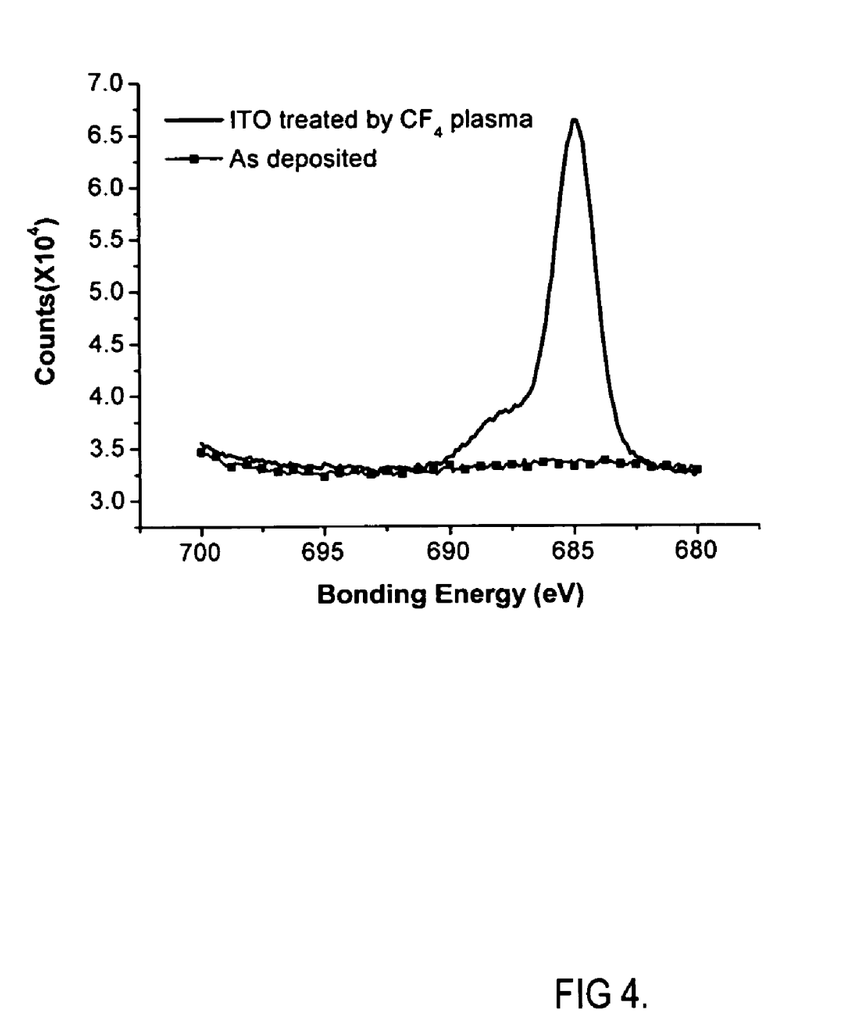
FIG. 4 shows the X-ray photoelectron spectroscopy (XPS) spectra of the F 1s core level of the ITO surface.

FIG. 3 shows an embodiment of the present invention. A metal fluoride layer 8 is added between the anode 6 and the hole transport layer 4. Anode buffer layer 5 is not used. The provision of this metal fluoride layer is an important part of this invention. The metal fluoride layer may be formed in a number of ways, for example it can be formed in a reactor where the ITO anode is exposed to a plasma of a fluorine-containing gas, especially $CF_4$ or $SF_6$, for a period of no longer than about 30 seconds. The plasma can be generated by applying either a RF input signal or a DC input signal at a appropriate power to the reactor. For example the plasma may be generated by an input electrical signal at 13.56 MHz or 187 kz. The plasma may also be generated by a DC electrical signal. FIG. 4 shows the XPS spectra of the F Is core level of the ITO anode surface before and after exposure to the plasma. After the plasma pretreatment, a spectra peak appeared at approximately 685 eV, which indicates formation of a metal fluoride species on the ITO surface. A useful range of the thickness of the metal fluoride layer is 0.5 to 2.5 nm, preferably 0.5 to 2 nm. Where the anode is ITO the metal fluoride layer will be $InF_x$. The metal fluoride layer may also be formed by thermal evaporation or sputtering.

The following examples are presented for a further understanding of the invention. For purpose of brevity, the materials and the layers formed therefrom will be abbreviated as given below:

ITO: indium tin oxide (anode)
NPB: 4,4'-bis-[N-(1-naphthyl)-N-phenylamino]-bi-phenyl (hole-transporting layer)
CuPc: copper phthalocyanine (hole injecting layer disposed over anode)
Alq: tris (8-quinolinolato-N1, 08)-aluminum (electron-transporting layer; functioning here as a combined light-emitting layer and electron-transporting layer)
LiF/Al: Lithium Fluoride and Aluminum (cathode)

EXAMPLE 1

Prior Art

An EL device was constructed in the following manner.

(a) The top surface of a glass substrate was coated with an 80 nm indium-tin-oxide (ITO) layer. The coated substrate was then sequentially ultrasonicated in a commercial detergent, rinsed in deionized water, dried in an oven at 100° C. for 1 hour. The substrate was then moved to the pre-treatment chamber and treated with oxygen plasma for 10 minutes.

(b) A hole transporting layer of 70 nm NPB was deposited onto the ITO layer by conventional thermal evaporation.

(c) An electron transporting and light emission layer of 60 nm Alq was then deposited onto the NPB layer by conventional thermal evaporation.

(d) A 0.9 nanometer LiF layer was deposited on Alq.

(e) Finally, a 120 nanometer aluminum layer was overcoated on the LiF layer.

EXAMPLE 2

Prior Art

Another EL device was constructed in the following manner.

(a) The top surface of a glass substrate was coated with an 80 nm indium-tin-oxide (ITO) layer. The coated substrate was sequentially ultrasonicated in a commercial detergent, rinsed in deionized water, dried in an oven at 100° C. for 1 hour. The substrate was then moved to the pre-treatment chamber and treated with oxygen plasma for 10 minutes.

(b) An organic buffer layer of 15 nmCuPc was deposited on the ITO layer by conventional thermal evaporation.

(c) A hole transporting layer of 70 nm NPB was deposited onto the CuPc layer by conventional thermal evaporation.

(d) An electron transporting and light emission layer of 60 nm Alq was then deposited onto the CuPc layer by conventional thermal evaporation.

(e) A 0.9 nm LiF was deposited on the Alq layer.

(f) Finally, a 120 nm aluminum layer was overcoated on the LiF

EXAMPLE 3

Embodiment of the Present Invention

Another device was prepared using the following manner.

(a) The top surface of a glass substrate was coated with an 80 nm indium-tin-oxide (ITO) layer. The coated substrates was sequentially ultrasonicated in a commercial detergent, rinsed in deionized water, dried in an oven at 100° C. for 1 hour.

(b) A 1.2 nm thick metal fluoride layer was formed on the ITO layer in the plasma of $CF_4$ gas under RF or DC electrical field.

(c) A hole transporting layer of 70 nm NPB was deposited onto the metal fluoride layer by conventional thermal evaporation.

(d) An electron transporting and light emission layer of 60 nm Alq was then deposited onto the NPB layer by conventional thermal evaporation.

(e) A 0.9 nanometer LiF layer was deposited on Alq.

(f) Finally, a 120 nanometer aluminum layer was overcoated on the LiF layer.

EXAMPLE 4

Another device was prepared using the following manner, which is similar to example 1 except for ITO pretreatment.

(a) The top surface of a glass substrate was coated with an 80 μm indium-tin-oxide (ITO) layer. The coated substrate was sequentially ultrasonicated in a commercial detergent, rinsed in deionized water, dried in an oven at 100° C. for 1 hour.

(b) A hole transporting layer of 70 nm NPB was deposited onto the ITO layer by conventional thermal evaporation.

(c) An electron transporting and light emission layer of 60 nm Alq was then deposited onto the NPB layer by conventional thermal evaporation.

(d) A 0.9 nanometer LiF layer was deposited on Alq.

(e) Finally, a 120 nanometer aluminum layer was overcoated on the LiF

EXAMPLES 5A AND 5B

A prior art device for comparison (Example 5A) and an embodiment of the invention, (Example 5B) were fabricated as follows with an anode of silver. In each example 60 nm thick Ag anodes were deposited on a 1.1 mm thick bare glass sheet. The anode of Example 5B was treated by $CF_4$ plasma treatment chamber in accordance with an embodiment of the invention. Then the following layers were added in sequence to both Examples 5A and 5B from a heated boat in a vacuum chamber under a vacuum of less than $1\times10^{-6}$ torr:

(a) a hole-transporting layer consisting of 140 nm NPB;

(b) a cathode layer consisting of 110 nm Al.

Figure 5:
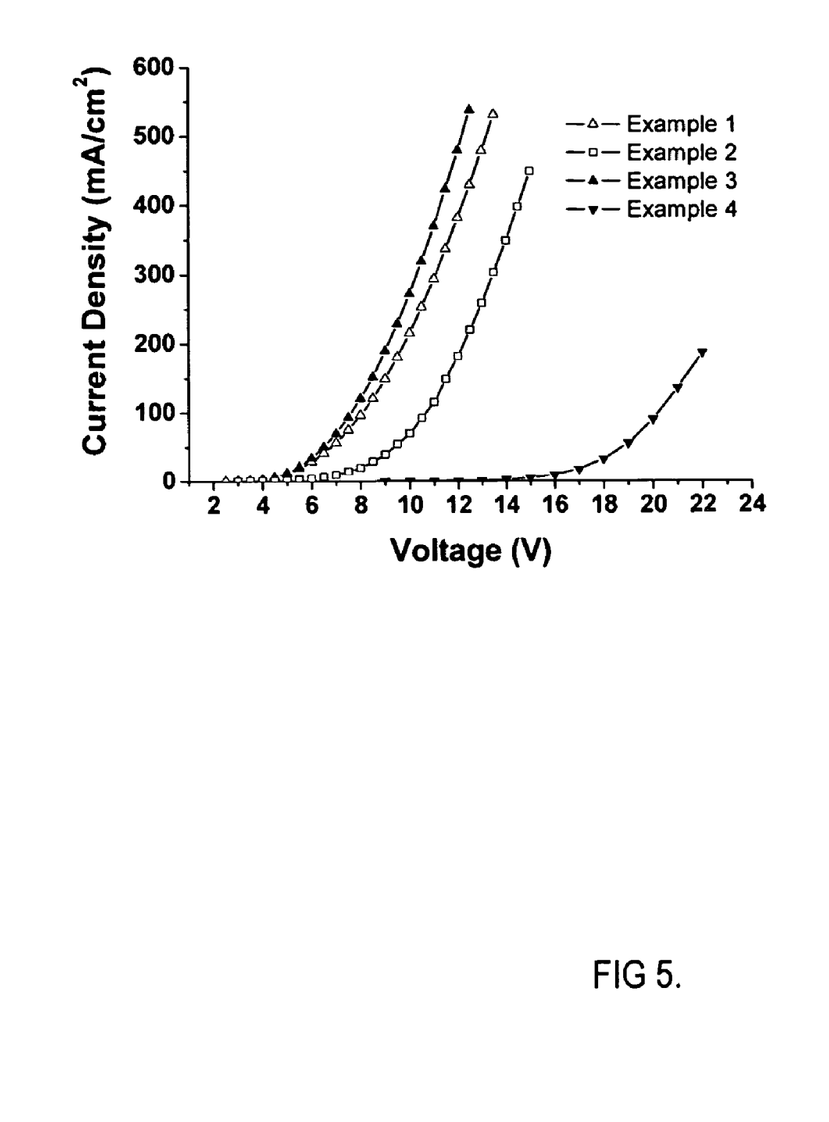
FIG. 5 shows the current—voltage characteristics of OLEDs according to embodiments of the invention in which a 0.5-2 nm thick metal fluoride is used.

FIG. 5 shows the current density of the devices described in Examples 1, 2, 3 and 4 as a function of driving voltage. It can be seen from the figure, that when a metal fluoride with thickness of 0.5-2 nm was interposed between the anode ITO and the hole transporting layer NPB, the device shows fast-rising J-V curve and low operation driving voltage, as compared to those obtained from devices of Example 1, 2 and 4.

Figure 6:
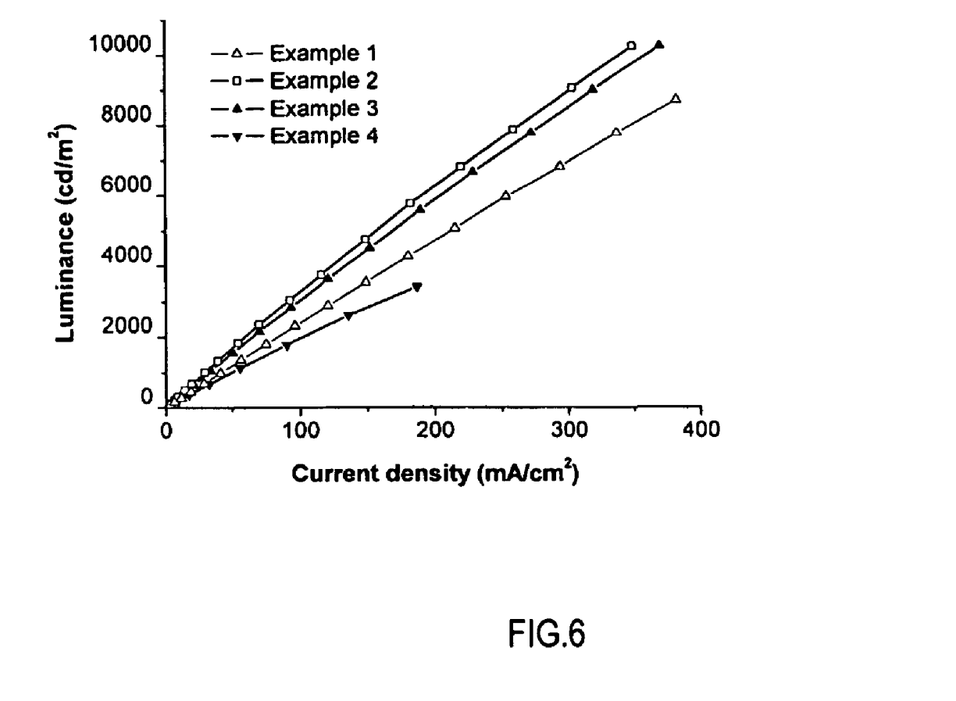
FIG. 6 shows the luminance—current density characteristics of OLEDs according to embodiments of the invention in which a 0.5-2 nm thick metal fluoride is used, FIG. 7. shows the power efficiency (lm/W)—current density characteristics of OLEDs according to embodiments of the invention in which a 0.5-2 nm thick metal fluoride is used.

FIG. 6 shows the luminance of the devices described in Examples 1, 2, 3 and 4 as a function of current density. It can be seen from the figure, that the current efficiency determined from the device of Example 3 is higher than those of the devices from Example 2 and 4.

Figure 7:
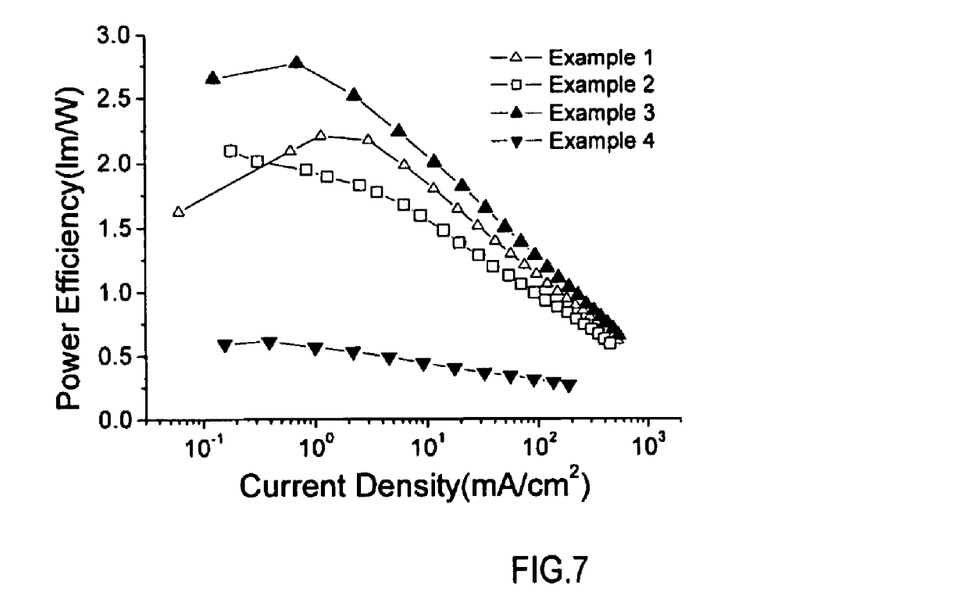

FIG. 7 shows the power efficiency of devices described in Example 1, 2, 3, and 4 as function of current density. It can be seen from the figure, that when a metal fluoride with thickness of 0.5-2 nm was interposed between the anode ITO and the hole transporting layer NPB, the device show high power efficiency as compared to those obtained from devices of Example 1, 2, and 4.

Figure 8:
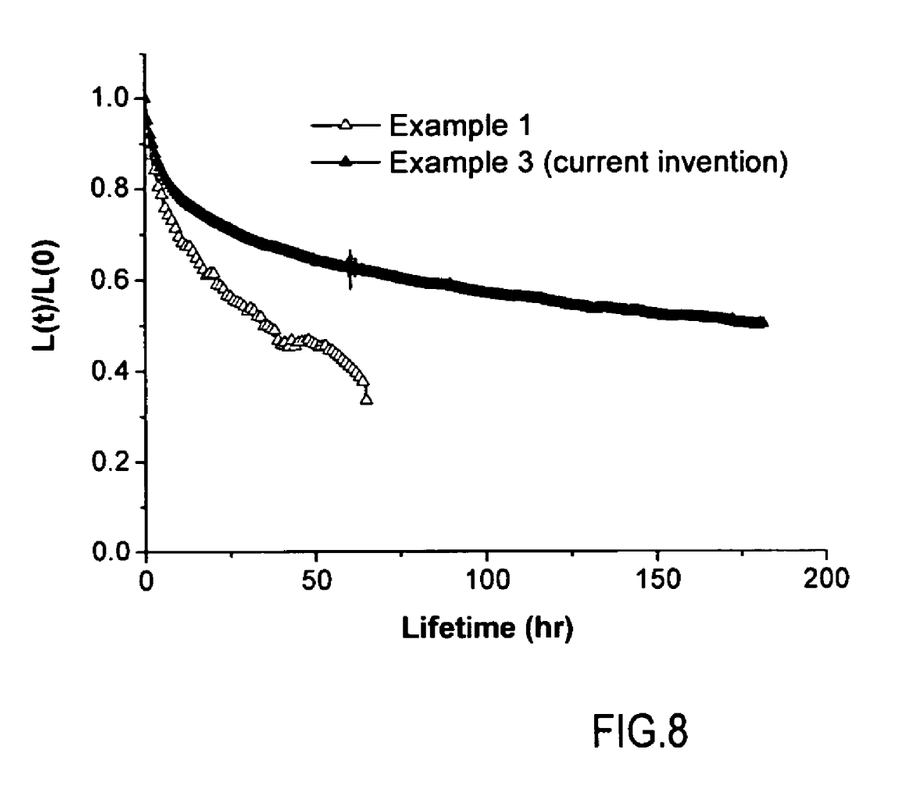
FIG. 8 shows the EL output as function of operation time for OLEDs according to embodiments of the invention in which a 0.5-2 nm thick metal fluoride is used.

FIG. 8 shows operational stability measured on the device of Examples 1, and 3. Both devices were tested at a constant density of 50 mA/cm$^2$, and the EL output was monitored by Silicon photodetectors. The device of Example 3 with a 0.5-2 nm metal fluoride layer imposed between anode ITO and hole transporting layer NPB showed a superior operational stability over the device of Example 1. The EL output of device of Example 3 is 50% after operation for 180 hours while the drop from the device of Example 1 is 60% after operation for 60 hours. This result indicates that an extra-thin metal fluoride layer by plasma treatment on ITO can significantly improve device stability.

Figure 9:
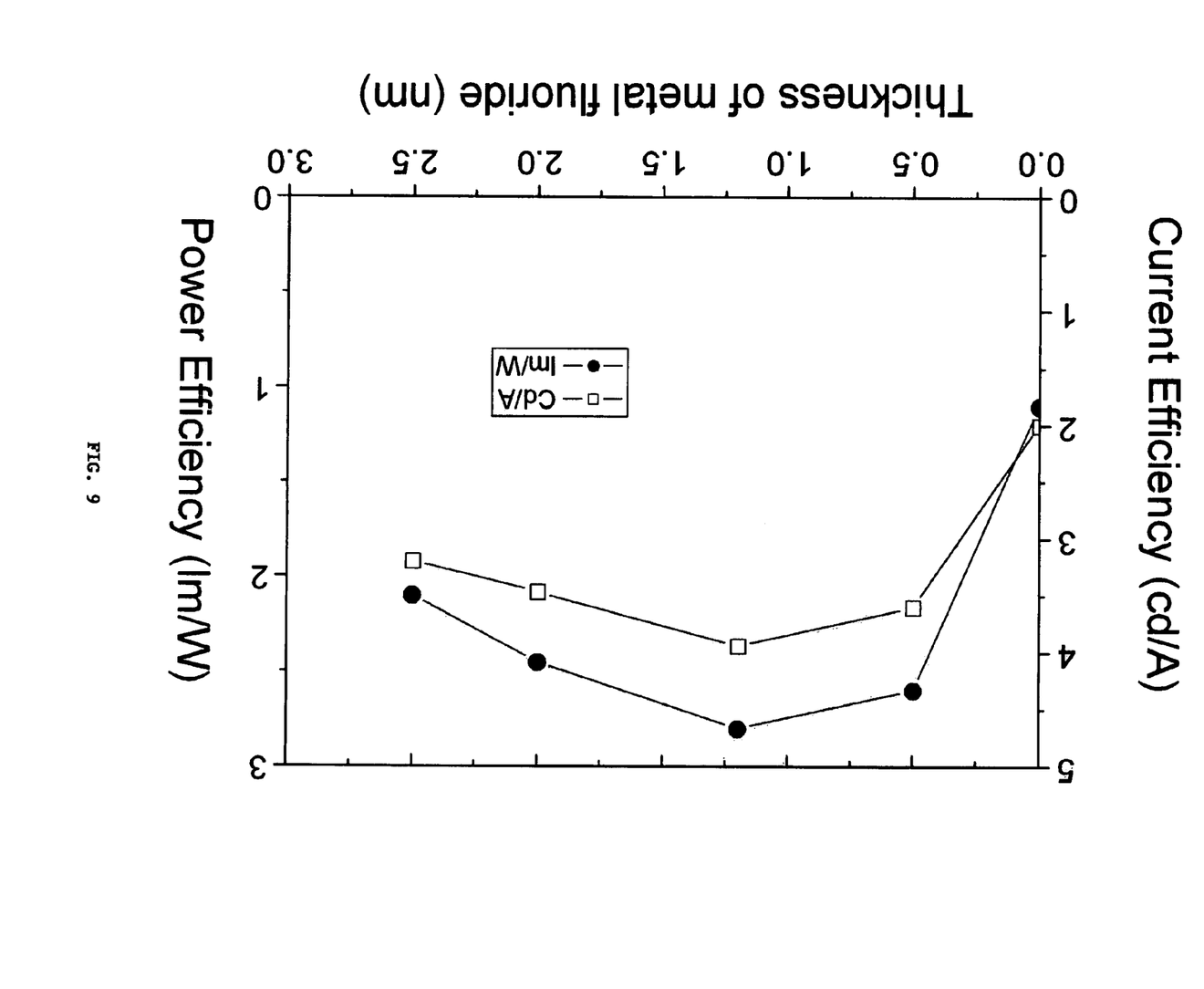
FIG. 9 shows the current and power efficiency for a number of embodiments of the present invention with different metal fluoride thicknesses.

To determine an optimum thickness for the metal fluoride layer a number of samples were prepared according to Example 3 but with metal fluoride layer of different thicknesses (including zero thickness, 0.5 nm, 1.2 nm, 2.0 nm and 2.5 nm). FIG. 9 shows plots of current efficiency and power efficiency for these samples. From FIG. 9 it can be seen that optimum results can be obtained with a thickness of about 1.2 nm for the metal fluoride layer, though there is still a significant improvement in performance with a thickness of anywhere between 0 nm and 3 nm, more preferably 0.5 nm to 2.5 nm.

Figure 10:
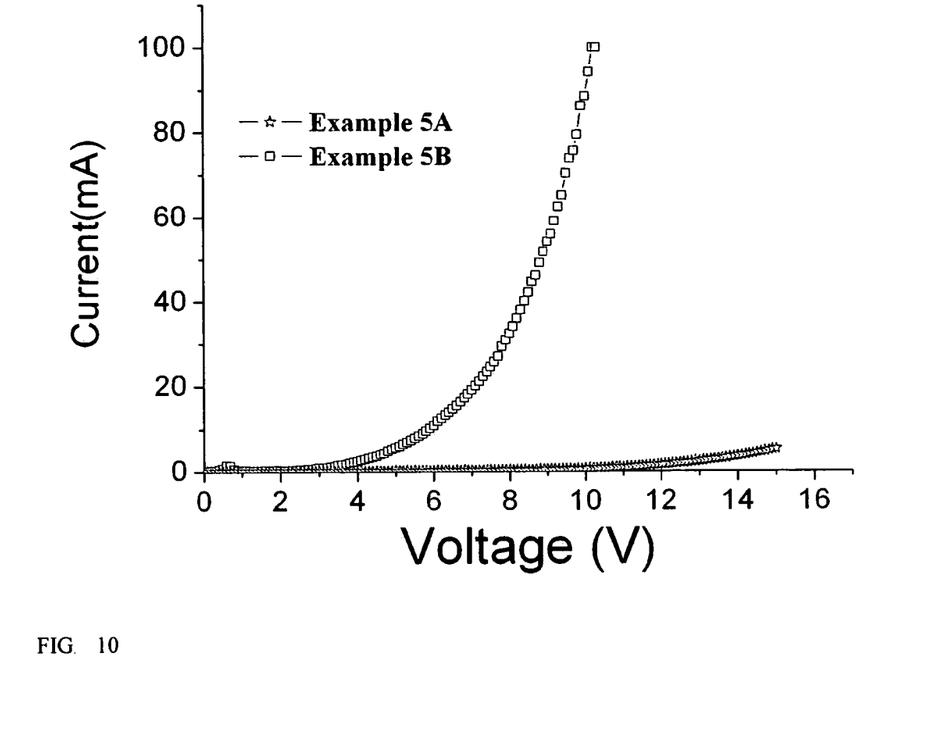
FIG. 10 shows the current-voltage relationship of a device according to an embodiment of the invention and a device according to the prior art.

FIG. 10 shows the current voltage relationships of the devices of Examples 5A and 5B. It can be seen from FIG. 10 that when the Ag anode is modified by the $CF_4$ plasma (Example 5B) the device shows a fast-rising I-V curve and low operation driving voltage as compared to those obtained from the device of Example 5A.

The invention claimed is:

1. An organic electroluminescent device comprising an anode, a cathode, and an organic light emitting layer sandwiched between the anode and the cathode, the anode comprising:

(a) a conducting anode layer, and (b) a metal fluoride compound layer, wherein the metal fluoride compound layer is formed by exposing the conducting anode layer to a fluorine-containing gaseous plasma in a low vacuum.

2. The electroluminescent device of claim 1 wherein the metal fluoride compound layer is exposed to the fluorine-containing gaseous plasma for a period of time of no longer than 30 seconds.

3. The electroluminescent device of claim 1 wherein the conducting anode layer is formed of indium tin oxide.

4. The electroluminescent device of claim 1 wherein the conducting anode layer is formed of metal.

5. The electroluminescent device of claim 4 wherein the metal is selected from the group consisting of silver, aluminum, gold, nickel, and steel.

6. The electroluminescent device of claim 1 wherein the metal fluoride compound layer is $InF_x$.

7. The electroluminescent device of claim 1 wherein the metal fluoride compound layer has an average thickness in a range of 0.5 to 2.5 nm.

8. The electroluminescent device of claim 1 wherein the fluorine-containing gaseous plasma comprises a gas selected from group of gases consisting of $CF_4$ or $SF_6$.

9. The electroluminescent device of claim 1 wherein the fluorine-containing gaseous plasma is generated by an input electrical signal at 13.56 MHz or 187 kHz.

10. The electroluminescent device of claim 1 wherein the fluorine-containing gaseous plasma is generated by an input DC electrical signal.

11. The electroluminescent device of claim 1 wherein the cathode is formed of magnesium or aluminum or silver or a combination thereof.

12. The electroluminescent device of claim 1 wherein an organic hole transport layer is provided between the metal fluoride compound layer and the organic light emitting layer.

13. The electroluminescent device of claim 1 wherein an organic electron transport layer is provided between the cathode and the organic light emitting layer.

14. The electroluminescent device of claim 1 wherein an inorganic insulating layer is provided between the cathode layer and the organic light emitting layer.

15. The electroluminescent device of claim 14 wherein the inorganic insulating layer is lithium fluoride or cesium fluoride.

16. The electroluminescent device of claim 12, wherein the metal fluoride compound layer is adapted to provide efficient hole injection into the organic hole transport layer.

17. The electroluminescent device of claim 12, wherein the metal fluoride compound layer is adapted to form a stable interface with the organic hole transport layer.

18. The electroluminescent device of claim 1, wherein the metal fluoride compound layer is conductive or insulating.

19. The electroluminescent device of claim 1 further comprising a substrate that is optically transparent and is formed from glass or plastic.

20. The electroluminescent device of claim 1 further comprising a substrate that is opaque and is formed from a ceramic or semiconducting material such as silicon.

21. The electroluminescent device of claim 1 wherein the cathode is metal and the organic light emitting layer is formed by deposition on a substrate by thermal evaporation.

22. The electroluminescent device of claim 1 wherein the conducting anode layer is formed by sputtering.

23. The electroluminescent device of claim 1 wherein the metal fluoride compound layer is formed by thermal evaporation.

24. The electroluminescent device of claim 1 wherein the metal fluoride compound layer is formed by sputtering.

* * * * *